United States Patent [19]

Hanneman

[11] 3,872,397

[45] Mar. 18, 1975

[54] METHOD AND APPARATUS FOR DECREASING CHANNEL SPACING IN DIGITAL FREQUENCY SYNTHESIZERS

[75] Inventor: Charles K. Hanneman, Overland Park, Kans.

[73] Assignee: King Radio Corporation, Olathe, Kans.

[22] Filed: Nov. 7, 1973

[21] Appl. No.: 413,616

[52] U.S. Cl. .................................. 331/1 A, 331/25

[51] Int. Cl. .............................................. H03b 3/04

[58] Field of Search ............. 328/14, 15, 18, 25, 48, 328/155; 331/1 A, 17, 25

[56] References Cited

UNITED STATES PATENTS

| | | | |
|---|---|---|---|
| 3,320,546 | 5/1967 | Allen et al. | 328/25 X |
| 3,382,453 | 5/1968 | Dotter | 331/1 A |
| 3,411,102 | 11/1968 | Sommerud et al. | 328/14 X |
| 3,484,712 | 12/1969 | Foote et al. | 331/1 A |
| 3,538,442 | 11/1970 | Arkell et al. | 328/48 X |
| 3,551,826 | 12/1970 | Sepe | 328/25 X |
| 3,714,589 | 1/1973 | Lewis | 328/155 |
| 3,769,597 | 10/1973 | Mayer | 328/15 X |
| 3,789,308 | 1/1974 | Lowdenslager | 328/155 |

*Primary Examiner*—John S. Heyman
*Attorney, Agent, or Firm*—Lowe, Kokjer, Kircher

[57] ABSTRACT

A method and apparatus for digital frequency synthesis is provided which enables the channel spacing of a digital synthesizer to be decreased below a reference frequency. The frequency clock output of a voltage controlled oscillator is digitally divided by an average multiple which may be other than a whole number. The output of the divider forms the input to a digital phase comparator which compares the phase of the reference frequency and the input or feedback frequency and generates a signal output that has a duty cycle proportional to the phase difference between the reference and feedback frequencies. The last mentioned output signal eventually is used to bias the voltage controlled oscillator to the proper output frequency so that the feedback and reference frequencies have a constant phase difference. Since the average multiple of the divider can be varied fractionally, a plurality of output signals from the voltage controlled oscillator are obtainable which have frequency spacing between them of some frequency less than the reference frequency.

6 Claims, 3 Drawing Figures

METHOD AND APPARATUS FOR DECREASING CHANNEL SPACING IN DIGITAL FREQUENCY SYNTHESIZERS

BACKGROUND AND BRIEF DESCRIPTION OF THE INVENTION

The subject invention relates to a method and apparatus for providing decreased channel spacing into radio transmitters and receivers and in particular to transmitters-receivers utilized in general aviation aircraft.

In most prior art radio systems, digital frequency synthesis generally has been accomplished by the use of a digital divider in conjunction with a phase locked loop. This form of apparatus utilizes a digital phase comparator that compares the phase of a reference frequency and a feedback frequency to generate an output signal that has a duty cycle proportional to the phase difference between the reference and feedback frequencies. A low pass filter recovers the DC component of this signal with same then being utilized to bias a voltage controlled oscillator to the proper frequency such that the feedback signal phase at the phase comparator and the phase of the reference signal have a constant phase difference.

The output frequency of the voltage controlled oscillator is related directly to the reference frequency by the equation $F_0=NF_r$, where $F_o$ is equal to the output frequency, $F_r$ is the reference frequency, and N is a constant enumerated herein and in the art as the division ratio. In prior art systems, the function N was a whole number, and the minimum channel spacing was necessarily equal to the reference frequency, as the output frequency equals the reference frequency when N=1. If decreased spacing between channels was desired, if heretofore was believed necessary to lower the reference frequency. From the above equation, it is apparent that channel spacing of a digital synthesizer can be decreased below the reference frequency if N is made less than a whole number (e.g., a fraction). Consequently, if a divider is provided that will divide by a fractional amount, for example, one and one-half, a transmitter can be provided that has twice the number of channels at half the channel spacing as a prior art device having the same reference frequency.

Presently, aircraft communication frequencies commonly comprise a plurality of fifty khz channels. That is, the total frequency band available for aircraft use is divided into a plurality of channels centered on fifty khz frequencies. It long has been apparent that the fifty khz separation is insufficient in many areas, particularly when approaching large population density centers having high air traffic volume, involving both commercial and general aviation. Often the number of aircraft attempting to approach these population centers is so great that all available transmitting frequencies are saturated. For some time commercial airlines have utilized radio transmitting and receiving equipment having twenty-five khz channel spacing. As saturation of available fifty khz channels increases, the search for an efficient, low cost method and apparatus for obtaining smaller channel separation has expanded greatly. The known prior art in this area has generally developed along the theory that reduced channel spacing should be obtained by reducing the reference frequency. The subject invention disclosed hereinafter utilizes a unique method and circuit for changing the division ratio rather than the frequency in order to decrease channel spacing. Consequently, channel spacing can be halved, as in the preferred embodiment, or divided by thirds or fourths.

One of the primary objects of this invention is to provide a uniquely constructed radio transmitter-receiver having decreased channel spacing therein.

Another object of this invention is to provide a unique avionics radio transmitter-receiver having channel spacing at frequency increments other than whole number multiples of the reference frequency.

Another object of this invention is to provide a programmed frequency divider for use in an avionics radio transmitter-receiver that divides a reference frequency by a number other than an integer.

Another object of this invention is to provide a radio transmitter-receiver having decreased channel spacing which may be manufactured at low cost and which will decrease radio channel saturation in congested areas.

A further object of this invention is to provide a radio transmitter-receiver of the character described, utilizing a relatively high reference frequency while providing an increased number of channels.

These and other objects of the invention, together with the features of novelty appurtenant thereto, will appear in the course of the following description.

DETAILED DESCRIPTION OF THE INVENTION

In the accompanying drawings, which form a part of the specification and which are to be read in conjunction therewith and in which like reference numerals are employed to indicate like parts in the various views.

Figure 1:
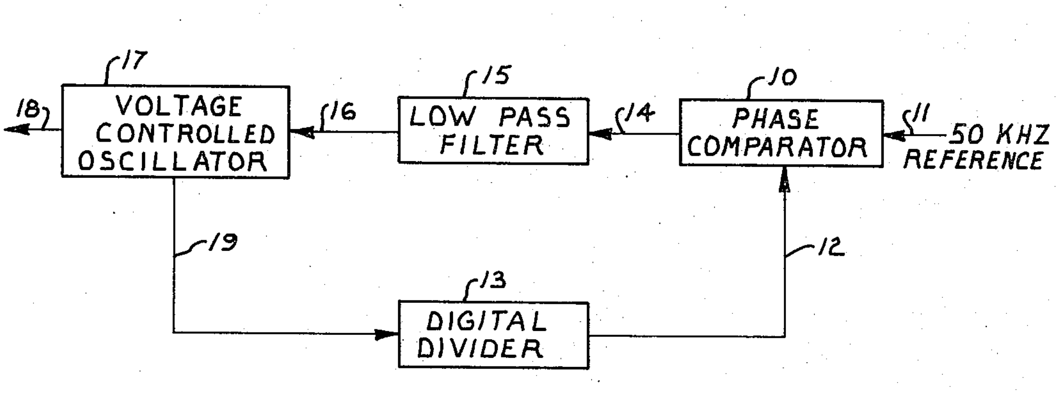
Fig. 1. PRIOR ART
FIG. 1 is a block circuit diagram of a digital frequency synthesizer labelled as prior art.

Turning now more specifically to the drawings, FIG. 1 represents a block schematic diagram of a typical prior art device. As indicated therein, digital frequency synthesis generally has been accomplished by using a digital divider in conjunction with a phase locked loop. A digital phase comparator 10 receives the 50 khz reference frequency at input 11. This signal is compared with a feedback signal forming a second input to the phase comparator 10 on conductor 12 and is conventionally obtained from a digital divider generally indicated by the numeral 13.

Output of the phase comparator 10 forms an input, along a conductor 14, to a low pass filter means 15. The DC component of the input signal appears at a conductor 16 and is used to bias a voltage controlled oscillator 17 to the proper frequency output on lines 18 and 19. The output on line 19 is a frequency pulse input to the conventional digital divider 13, from which the feedback frequency is derived.

Figure 2:
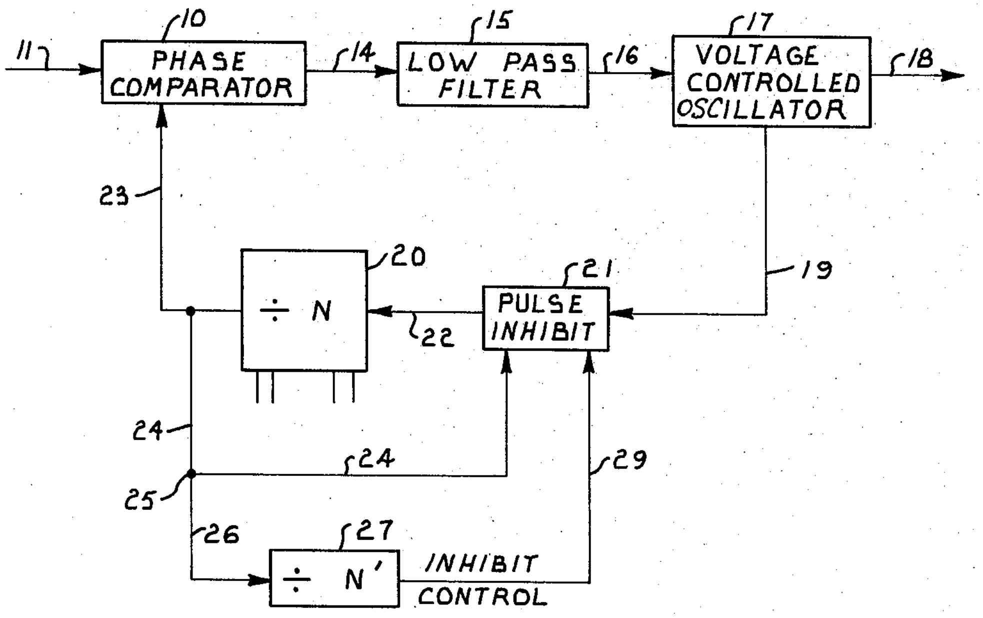
FIG. 2 is a block circuit diagram showing a unique digital frequency synthesis circuit for obtaining a plurality of output frequencies.

The above described circuit may be contrasted with the circuit shown in FIG. 2 which enables the output frequency on line 18 to be stepped up at increments of less than the reference frequency. Reference numerals common with the circuit shown in FIG. 1 are retained in FIG. 2 so that the reference frequency is indicated by an input to the phase comparator 10 on line 11. The comparator 10 functions in exactly the same manner as described in conjunction with FIG. 1. The output of the phase comparator 10 is electrically connected by the conductor 14 to the low pass filter 15 with the output of same on line 16 being delivered to the voltage controlled oscillator 17. The output of VCO 17 appears both on line 18 and as clock pulse output on line 19.

A divider 20 receives the clock pulse output as an input along the conductor 19 via an inhibit means 21 and a conductor 22. Output of the divider 20 forms an input along a conductor 23 to the phase comparator 10. A conductor 24 also is electrically connected between the output side of the divider 20 to an input side of the inhibit means 21. A conductor 26 is electrically connected to the output side of the divider 20 at a node 25 and to the input side of an inhibit control means 27. The output of inhibit control means 27 is then electrically connected, along a conductor 29, to the inhibit means 21.

The divider 20 in FIG. 2 has two modes of operation, e.g., a divide by N mode and divide by N+1 mode. The inhibit control means 27 may be properly programmed so that the inhibit means 21 will inhibit the input to the divider 20 for one or more input pulses, in accordance with a predetermined ratio. Thus, for example, where the frequency input is fifty khz and the desired channel spacing is twenty-five khz, proper control by inhibit control means 27 may be provided so that the inhibit means 21 will inhibit the input to the divider 20 for one clock pulse, every other time that the divider 20 produces an output. The average division ratio then is $[N+(N+1)]\div 2 = N+0.5$. That is, the divider 20 and pulse inhibit 21 alternately will divide by N and N+1 with the average result corresponding to N+0.5. The above process may be extended so that the inhibit control means 27 enables the inhibit means 21 to inhibit one input clock pulse for every three divider 20 output pulses or to inhibit one input clock pulse for two out of three divider 20 output pulses to yield an average division ratio of N+⅓ and N+⅔, respectively. Furthermore, division by a whole number may be accomplished by disabling the inhibit control means 27 or by setting the inhibit control means 27 so that divider 20 operates for each input pulse. The above procedure can be utilized to obtain any desired fraction simply by controlling the operation of the inhibit control means 27. Accordingly, the device shown in FIG. 2 provides a range of channel spacing with a particular input reference frequency without changing that reference frequency.

Figure 3:
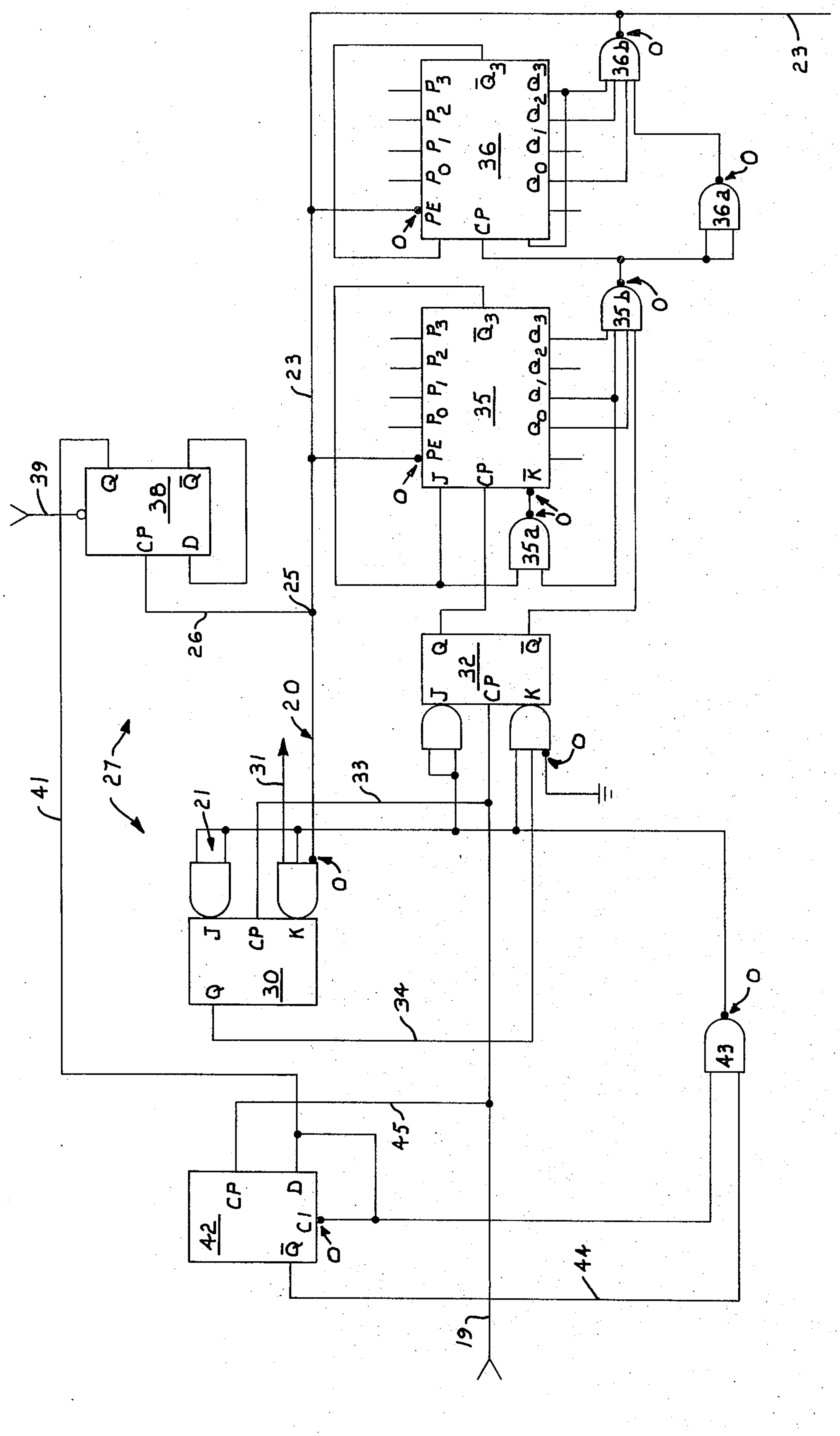
FIG. 3 is a more detailed schematic diagram of the circuit shown in FIG. 2.

Referring now to FIG. 3, the divider 20 is shown as a programmable divider having three synchronous, cascaded counters 32, 35 and 36, with the input inhibit means 21 comprising a flip-flop stage 30 connected thereto.

The divider 20 receives an input pulse along the conductor 19 which is fed to the divide by 2 flip-flop 32. The input pulse also is electrically connected to flip-flop 30 of input inhibit means 21 by a conductor 33 with flip-flop 30 being able to receive a control input signal on conductor 31. If the control input along the conductor 31 to the flip-flop 30 is zero, flip-flop 32 always will divide by two. If the input on conductor 31 is a one, an output will appear on conductor 34 to inhibit flip-flop 32 for one pulse period each time an output occurs on line 25 (negative going pulse). After one clock period, the flip-flop 30 returns to its original state and flip-flop 32 is permitted to continue its divide by two function. It should be noted that the above circuit has inhibited the divider 20 for one input period and that this adds on to the division ratio.

The remainder of divider 20 is comprised of the divide by 10 device 35 (including gates **35*a* and 35*b*) and the divide by fifteen device 36 (including gates 36*a* and 36*b*). As a result, the combined circuits, divide by 2, 10 and 15 (32, 35 and 36, respectively) provide 300 counter states (2×10×15). The input inhibit provides one additional state by inhibiting the input for one pulse. Since one input pulse is used to strobe present information to the register, there are a total of 301** available states, e.g., (2×10×15)+1, with each input pulse operating to step the counter to the next state. To divide by N, the counter is present N states away from the load state. After N input pulses, the load state is reached and an output pulse is generated. Thereafter, the counter is preset and the cycle is repeated. If the divider is inhibited for one input pulse, the next output pulse of the divider will be N+1 input pulses away from the last output pulse.

The devices 35 and 36 are four bit shift registers which, with appropriate gating, will divide the input signal by ten and by fifteen. The output pulse of the gate 36b appears on the conductor 23. As indicated above, when an output appears on line 23, flip-flop 30 will either inhibit the divider 20 for one clock pulse (if the input code along the conductor 31 is in the appropriate condition) or it will not. In this mode, divider 20 will be dividing by a whole number, and will thusly be operating as a conventional unit divider.

Control of the flip-flops 30 and 32 is additionally provided by inhibit control means 27 which includes flip-flops 38 and 42 along with a two input NAND gate 43. As indicated in FIG. 3, flip-flop 38 has a control input conductor 39. Proper selection of the input code along the line 39 enables the divider 20 to operate in its normal mode. That is, the divider 20 is a conventional units divider. However, if the input along conductor 39 is changed, the flip-flop 38 is enabled and receives the output of the divider 20 via the node 25 and the conductor 26 as an input. Flip-flop 38 divides the input from the divider 20 by 2 and generates an output pulse to the flip-flop 42 via the conductor 41. The flip-flop 42 changes state and the output of the flip-flop 42 is clocked in the next incoming clock pulse via conductor 19 so as to change state. This generates a pulse via conductor 44 connected between the flip-flop 42 and gate 43. The output of the gate 43 changes state, inhibiting the flip-flops 30 and 32. Flip-flop 42 is toggled by the next succeeding clock input pulse via a conductor 19 and a conductor 45 which resets the output side of flip-flop 42 with the gate 43 output side changing state again enabling the flip-flops 30 and 32. It should be noted that flip-flop 38 divides the output of the divider 20 by two. However, flip-flop 42, in one instance will inhibit the divider 20 by one clock pulse, and in the other instance, it performs no function. In other words, flip-flops 38 and 42 and gate 43 will inhibit flip-flops 30 and 32 one clock pulse every other time there is an output pulse along the conductor 23.

In effect, the above system will operate to alternately divide by a digit and a digit plus one on successive input frequency pulses so that the average division ratio is a digit plus one divided by two. Consequently, a frequency divider is provided having a division ratio other than a digit. The dividers 32, 35 and 36 typically divide in a range from 122 to 301 in discrete integer steps, i.e., 122, 123, 124. The use of inhibit means 21 and inhibit control means 27 with the divider 20 provides discrete channels of 122, 122.5, 123, 123.5 . . . Consequently, the available communication channels are doubled while the channel spacing is halved and the reference frequency is unchanged.

From the foregoing, it will be seen that this invention is one well adapted to obtain all the ends and objects herein set forth, together with other advantages which are obvious and which are inherent to the structure.

It will be understood that certain features and subcombinations are of utility and may be employed without reference to other features and subcombinations. This is contemplated by and is within the scope of the claims.

As many possible embodiments may be made of the invention without departing from the scope thereof, it is to be understood that all matter herein set forth and shown in the accompanying drawings is to be interpreted as illustrative and not in a limiting sense.

Having thus described my invention, I claim:

1. In a frequency synthesizer having a phase locked loop including a phase comparator that receives a reference frequency and compares it to a feedback frequency, delivers an output signal based on that comparison, and has a voltage controlled oscillator providing a frequency output based on the output of said phase comparator, and a digital divider electrically connected between said voltage controlled oscillator and said phase comparator for providing said feedback signal to said comparator, the improvement comprising means for causing the digital divider to either divide by the divide ratios N or N' thereby yielding an average ratio of $N_1 + N_2 + . . . N_N + N'_1 + N'_2 + ... N'_M N''$ wherein $N_1$ through $N_N$, $N'_1$ through $N'_M$ and $N''$ are integers and $N''$ equals $M + N$, said last mentioned means comprising means for changing said divide ratios N to N', and means for averaging the divide ratios N and N' by dividing the sum of $N_1 + N_2 . . . N_N + N'_1 + ... N'_M$ by $N''$.

2. The improvement as in claim 1 wherein said changing means includes inhibit means electrically connected to the input side of said divider, and inhibit control means for actuating said inhibit means, said inhibit control means connected between the output side of said divider and said inhibit means, said inhibit control means being selectively programmable to cause said inhibit means to vary the division ratio of said divider by inhibiting input signals to said divider according to a preselected schedule.

3. The improvement of claim 2 wherein said digital divider comprises a plurality of cascaded synchronous digital counter stages.

4. The improvement of claim 3 wherein said inhibit means comprises a first flip-flop electrically connected to the first stage of a three stage cascaded synchronous digital counter.

5. The improvement of claim 4 wherein said inhibit control means comprises a second flip-flop electrically connected to the output side of said divider, a third flip-flop having an output side electrically connected to said second flip-flop, and an NAND gate electrically connected between the output side of said second flip-flop and an input side of said first flip-flop.

6. A method of digital frequency synthesis, comprising:

presetting a digital divider N states away from a load state;

feeding output pulses from a frequency generating means to said digital divider;

providing an output pulse from said digital divider when the number of pulses from said frequency generating means equals N;

inhibiting a preselected number of pulses to said digital divider after a preselected number of output pulses from said digital divider;

enabling said digital divider after said preselected number of pulses are inhibited; and providing a succeeding output pulse from said digital divider when the number of pulses from said frequency generating means equals N.

* * * * *

UNITED STATES PATENT OFFICE

CERTIFICATE OF CORRECTION

Patent No. 3,872,397 Dated March 18, 1975

Inventor(s) Charles K. Hanneman

It is certified that error appears in the above-identified patent and that said Letters Patent are hereby corrected as shown below:

Col. 1, line 36, before "heretofore" the word "if" should be --it--.

Signed and sealed this 6th day of May 1975.

(SEAL)
Attest:

RUTH C. MASON
Attesting Officer

C. MARSHALL DANN
Commissioner of Patents and Trademarks